United States Patent
Howard

(10) Patent No.: US 7,154,047 B2
(45) Date of Patent: Dec. 26, 2006

(54) VIA STRUCTURE OF PACKAGES FOR HIGH FREQUENCY SEMICONDUCTOR DEVICES

(75) Inventor: Gregory E. Howard, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 336 days.

(21) Appl. No.: 10/788,711

(22) Filed: Feb. 27, 2004

(65) Prior Publication Data

US 2005/0191785 A1   Sep. 1, 2005

(51) Int. Cl.
*H05K 1/11* (2006.01)
*H05K 7/06* (2006.01)

(52) U.S. Cl. .................. 174/260; 174/262; 174/264; 174/266; 257/698; 257/700; 361/780; 361/794

(58) Field of Classification Search .................. None
See application file for complete search history.

(56) References Cited

U.S. PATENT DOCUMENTS

| | | | | |
|---|---|---|---|---|
| 6,137,161 A * | 10/2000 | Gilliland et al. | ............ | 257/678 |
| 6,661,316 B1 * | 12/2003 | Hreish et al. | ............... | 333/246 |
| 6,969,808 B1 * | 11/2005 | Shiraki | ........................ | 174/255 |
| 2003/0151905 A1 * | 8/2003 | Gottlieb | ........................ | 361/780 |
| 2004/0188826 A1 * | 9/2004 | Palanduz et al. | ........... | 257/700 |
| 2005/0063166 A1 * | 3/2005 | Boggs et al. | ............... | 361/780 |
| 2005/0248025 A1 * | 11/2005 | Tsai et al. | ................... | 257/691 |

\* cited by examiner

*Primary Examiner*—John B. Vigushin
(74) *Attorney, Agent, or Firm*—W. James Brady, III; Frederick J. Telecky, Jr.

(57) ABSTRACT

A substrate (300) for a package of high frequency semiconductor devices comprising a planar insulating substrate having a plurality of parallel, planar metal layers (301a, 301b, etc.) embedded in the insulator. The substrate further has at least one pair of parallel, metal-filled vias (302 and 303) traversing the substrate; the vias have a diameter and a distance from each other of at least this diameter. The metal in each via has a sheet-like extension (321a, 321b, etc.) in each of selected planes of said metal layers, resulting in an increased via-to-via capacitance so that the reflection of a high frequency signal is less than 10%.

14 Claims, 5 Drawing Sheets

VIA STRUCTURE OF PACKAGES FOR HIGH FREQUENCY SEMICONDUCTOR DEVICES

FIELD OF THE INVENTION

The present invention is related in general to the field of electronic systems and semiconductor devices and more specifically to improved structures and methods for the fabrication of substrates used in semiconductor packages for high frequency devices.

DESCRIPTION OF THE RELATED ART

Two of the ongoing trends in integrated circuit (IC) technology are the drives towards higher integration and shrinking component feature sizes. Both trends support the trend to higher operating speed and higher signal frequencies. Higher levels of integration include the need for higher numbers of signal lines and power lines, yet smaller feature sizes make it more and more difficult to preserve clean signals without mutual interference. In addition, with increasing signal frequencies, transmission and shielding of signals require careful attention.

These trends and requirements do not only dominate the semiconductor chips, which incorporate the ICs, but also the packages, which house and protect the IC chips. Actually, boards and other parts of an electronic product have to be included in these considerations as a system.

Modern semiconductor packages often include substrates, which consist of a stack of numerous alternating layers of insulators and conductors. Typically, the number of conductor/insulator routing layers may vary from 4 to 25 (some devices have only 1 metal layer); the thickness of a conductor layer may be between about 5 to 75 $\mu$m and the insulator thickness between approximately 25 to 2500 $\mu$m. High speed signals getting from the printed circuit board to the chip inside of a package have to pass along a metal-filled via through this stack of layers.

For high density input/output (I/O) designs involving hundreds up to thousands of signal and power ports, the package routing layers typically have a thickness between about 150 to 2500 $\mu$m. For high speed I/O designs, this thickness is an appreciable portion of a wavelength; for instance, for 6 to 12 Gbit designs (1 GHz or higher) this critical regime occurs at about 1000 $\mu$m. When the via portion of the package becomes an appreciable portion of a wavelength, its wave properties must match those of the source transmission lines. This means that the impedance of the via structure must match the impedance of the incoming and outgoing transmission lines.

Unfortunately, this impedance matching is not provided by conventional via structures and the design rules, which need to be followed for a given package technology. For example, if the minimum via pitch (center-to-center via spacing) needs to be 200 $\mu$m and the via diameter is 100 $\mu$m or less, then the impedance of this via-to-via pair is approximately 70 $\Omega$. The incoming lines, however, usually have an impedance of 50 $\Omega$. Consequently, the reflection at the vias will be about 0.17 or 17%; this corresponds to a match of about 15 dB. Combined with all other reflections in the system, these values represent an unacceptable system response.

A need has therefore arisen for a coherent, low-cost methodology of adjusting the via structure of packages for high frequency semiconductor devices. This methodology should result in excellent electrical package performance, especially concerning speed and power, mechanical stability, and high product reliability. The fabrication method of the via structure should be flexible enough to be applied for different semiconductor product families and a wide spectrum of design and process variations. Preferably, these innovations should be accomplished while shortening production cycle time and increasing throughput, and using the installed equipment base so that no investment in new manufacturing machines is needed.

SUMMARY OF THE INVENTION

One embodiment of the invention is a substrate for a package of high frequency semiconductor devices comprising a planar insulating substrate having a plurality of parallel, planar metal layers embedded in the insulator. The substrate further has at least one pair of parallel, metal-filled vias traversing the substrate; the vias have a distance from each other at least as great as their diameter. The metal in each via has a sheet-like extension in each of selected planes of said metal layers, resulting in an increased via-to-via capacitance so that the reflection of a high frequency signal is less than 10%.

It is a technical advantage of the present invention that the capacitance-enhancing metal extensions can be shaped in a number of different ways. In a preferred embodiment, the metal extensions are shaped approximately as rings surrounding each via in the plane of each metal layer.

In another preferred embodiment, the metal extensions are shaped as flat forks arranged so that, in one plane of the metal layers, the fork of the first via of that pair is oriented towards, and partially surrounds, the second via, while in the next plane of the metal layers, the fork of the second via is oriented towards, and partially surrounds, the first via of the pair.

Another embodiment of the invention is a high frequency semiconductor device having a semiconductor chip with at least one bond pad and a planar insulating substrate with a plurality of parallel, planar metal layers embedded in the insulator and input/output ports on the first and second substrate surface. The substrate has at least one pair of parallel, metal-filled vias traversing the substrate; the vias have a diameter and a distance from each other of at least this diameter, and connect the metal ports on the first and second surface. The metal in each via has a sheet-like extension in each of selected planes of the metal layers, resulting in an increased via-to-via capacitance so that the reflection of a high frequency signal is less than 10%. The chip is assembled on the first substrate surface so that the at least one chip bond pad is connected to one of the substrate ports on the first substrate surface. Interconnection elements are attached to the ports on the second substrate for connection to external parts.

Yet another embodiment of the invention is a method of fabricating a substrate for use in a high frequency semiconductor package. The method selects materials and structure of a planar insulating substrate having a plurality of parallel, planar metal layers embedded in the insulator, and then determines in each of selected metal layers those portions of the layer, which will provide, when attached to a metal-filled via, an enhancement of the capacitance of the via towards an adjacent via. Next, via extensions are formed while each of these metal layers are structured; the steps are repeated until the planar substrate is manufactured step by step. Next, at least one pair of parallel vias traversing the substrate is formed; the vias have a certain diameter and a distance from each other of at least that diameter. The vias are intended to connect metal ports on the substrate and are filled with metal, which also brings the vias in contact with the extensions at selected metal layers.

Embodiments of the present invention are related to high I/O count devices intended for high speed and power performance. It is a technical advantage that the invention offers the device designer several independent parameters to achieve an increased substrate via capacitance and thus reduced signal reflection, resulting in high speed, controlled signal integrity and inductance, and increased power performance. The parameters include the number and shape of the via extensions, and the number and position of the vias. One or more embodiments of the invention offer choices for chip-to-substrate interconnections such as controlled bonding wires, small gold bumps, or more massive reflow bumps. Furthermore, several of these choices make the device less sensitive to environmental influences or temperature variations.

The technical advances represented by certain embodiments of the invention will become apparent from the following description of the preferred embodiments of the invention, when considered in conjunction with the accompanying drawings and the novel features set forth in the appended claims.

DETAILED DESCRIPTION OF THE PREFERRED EMBODIMENTS

Figure 1:
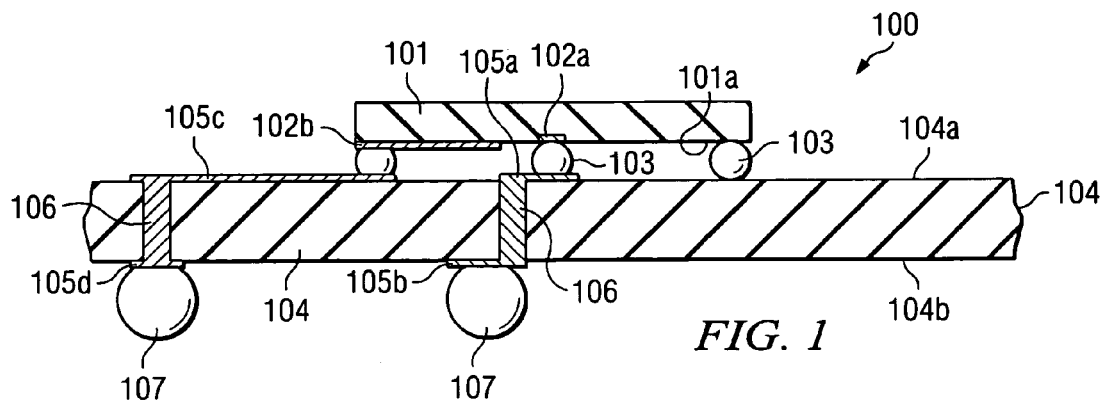
FIG. 1 is a schematic cross section of a semiconductor device having a flip-assembled chip on a substrate with metal-filled vias and interconnection elements for attachment to external parts.
Figure 2:
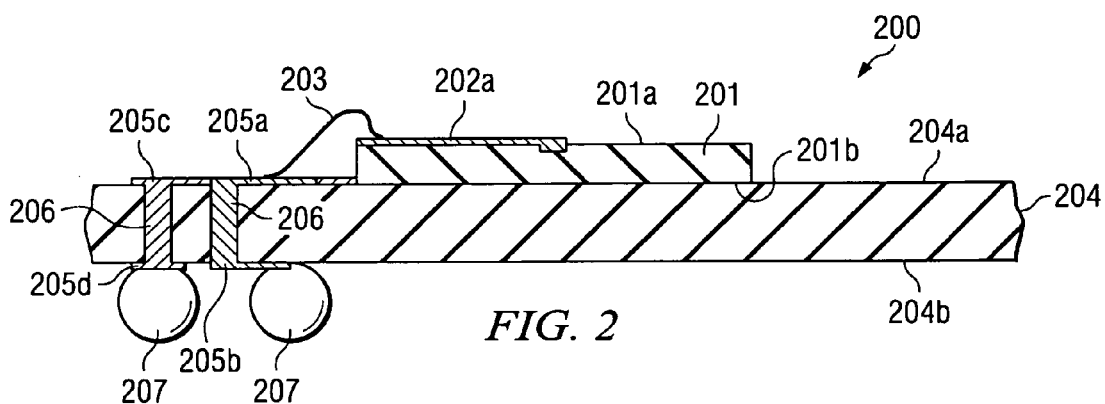
FIG. 2 is a schematic cross section of a semiconductor device having a bonding wire assembled chip on a substrate with metal-filled vias and interconnection elements for attachment to external parts.

FIGS. 1 and 2 depict schematically cross sections through semiconductor devices generally designated 100 and 200, respectively. The devices consist of a semiconductor chip 101 and 201, respectively, having an integrated circuit on its active surface 101a and 201a, respectively. The semiconductor material of chip 101 or 102 may be silicon, silicon germanium, gallium arsenide, or any other semiconductor material. In FIG. 1, the active surface has a plurality of bond pads 102a, 102b, etc. and an interconnection element 103 attached to each bond pad. In FIG. 2, a bond pad 202a is shown suitable for connection by means of a bonding wire 203.

In FIGS. 1 and 2, the devices 100 and 200 further include a substrate 104 and 204, respectively. The substrates are made of insulating material, for example ceramic or plastic such as FR-4. The substrates have first and second surfaces, 104a and 104b, respectively, in FIG. 1 and 204a and 204b, respectively, in FIG. 2. On each surface, the substrates have metallic contact pads, or ports, often as parts of a network of metallic traces. In FIG. 1, these ports and traces are designated 105a and 105c on first surface 104a, and 105b and 105d on second surface 104b. In FIG. 2, the ports and related traces are designated 205a and 205c on first surface 204a, and 205b and 205d on second surface 204b. As these FIGs. illustrate, the ports are often portions of the electrical traces of the substrate (strictly speaking, there are traces on the substrate surfaces and traces in the multilayer metallization inside the substrate; only few traces are shown in FIGS. 1 and 2).

In FIG. 1, the semiconductor chip 101 is flip-assembled on substrate 104 by attaching the interconnection elements 103 on the active surface of the chip to the ports 105a on the first substrate surface. In FIG. 2, the passive surface 201b of semiconductor chip 201 is mounted on first substrate surface 204a; the bond pad 202a (representing only one out of a plurality) is wire bonded to port 205a on the first substrate surface 204a.

Attached to the ports 105b, 105d in FIG. 1, and 205b and 205d in FIG. 2, are interconnection elements 107 and 207, respectively. These elements are typically made of reflowable material such as solder, and are intended to interconnect the device to external parts.

Metal-filled vias connect the substrate ports of the devices 100 and 200. In FIG. 1, the vias are designated 106, and in FIG. 2, the vias are designated 206. For high frequency devices, these vias become a substantial part of the electrical impedance because of the (relative) permittivity of the dielectric substrate material surrounding the vias.

For high frequency devices, the frequency content of the electrical signals is such that the device package size is an appreciable portion of the electrical wavelength, for instance one fifth of the wavelength or larger. At these frequencies or greater, the impedance of the electrical traces control, whether an electrical signal can travel through the package. As discussed in conjunction with FIGS. 1 and 2, part of the electrical path of a package includes the vias through the package substrate.

As an example, in a 2.5 mm thick low-temperature co-fired ceramic substrate, the permittivity $\epsilon$ is about 5, and the electrical wavelength is about 12.5 mm. Consequently, the frequency at which the impedance of the substrate traces start controlling the transmission of an electrical signal is approximately 10 GHz.

The invention utilizes that the characteristic impedance of a twin lead cylindrical conductor line is given by $$Zo = \sqrt{L/C},$$

where L is the transverse electromagnetic inductance, and C is the transverse electromagnetic capacitance (see for instance David M. Pozar, "Microwave Engineering", p. 73, Addison-Wesley Publishing Company, 1990). For an infinitely long line, the transverse electromagnetic field is static and an inductance and a capacitance can be defined. If the cylindrical lines have the radius a and the center-to-center distance D, the inductance is given by $$L = \mu/\pi \cos h^{-1}(D/2a),$$

wherein $\mu$ is the material permeability. The capacitance is given by $$C = \pi\epsilon[\cos h^{-1}(D/2a)].$$

Inserting these equations in the above equation for Zo, the invention derives $$Zo = \sqrt{\mu/\epsilon} \cdot 1/\pi \cdot \cos h^{-1}(D/2a).$$

In the substrates for high frequency semiconductor devices, the cylindrical conductor lines are typically realized by metal-filled vias, which connect metal ports located on each surface of the substrates. Applying the above equations for a pair of vias, for a typical 50 Ω impedance (which is a standard impedance required in design), the ratio of D/2a is close to 1. This means that the two vias would be almost touching each other.

On the other hand, according to standard package design rules, the via diameters are in the range from about 100 to 250 μm. The vias are spaced at a pitch of twice the via diameter. However, for high frequency packages, the via spacing should be much less than the via diameter, on the order of about 25 μm. This would be impractical to fabricate, since the substrate via pitch is usually twice the via diameter. Consequently, it is extremely difficult to design lines with impedance of about 50 Ω using only the conventional via diameter and via-to-via spacing as design variables.

Figure 3:
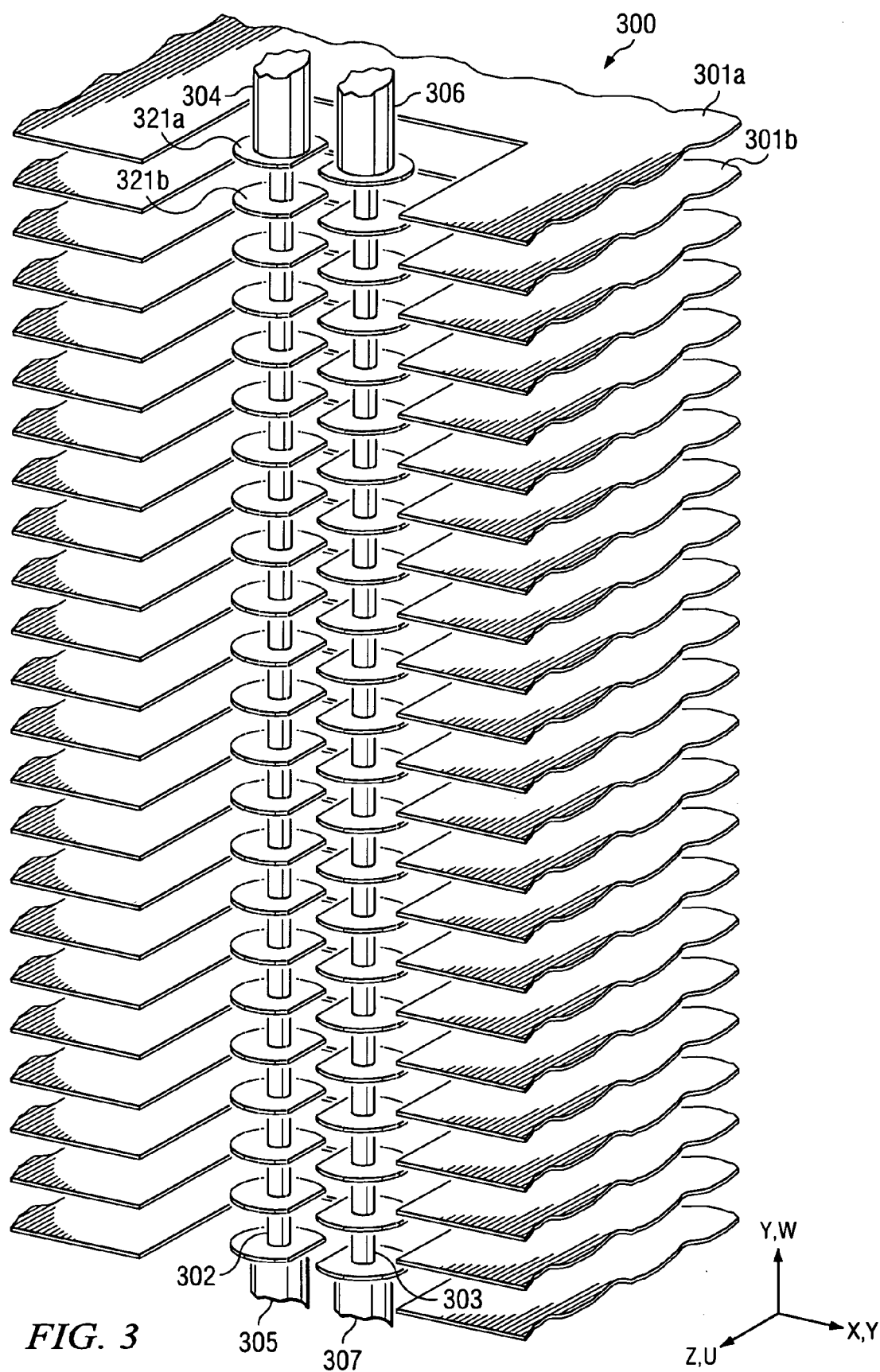
FIG. 3 illustrates a schematic perspective view of an embodiment of the invention comprising an insulating substrate having a plurality of parallel, planar metal layers and a pair of vias having metal extensions.

The solution to create lower impedance Zo values, offered by the embodiments of this invention, is the concept of increasing the capacitance between the vias. The embodiment illustrated in the schematic perspective view of FIG. 3 shows a planar substrate, generally designated 300, which has a plurality of parallel, planar metal layers 301*a*, 301*b*, . . . etc. (23 layers are depicted in FIG. 3). The metals are preferably copper or a copper alloy with a thickness around 100 μm. The layers are patterned to serve as routing traces (not shown in FIG. 3). The space between metal layers 301 is filled with insulating dielectric (not shown in FIG. 3) of about 1000 to 2500 μm thickness.

Traversing substrate 300 is at least one pair of vias 302 and 303. Vias 302 and 303 are parallel to each other and filled with metal, preferably copper or copper alloy. The vias typically serve to connect metal ports on the substrate surfaces. For example, via 302 connects ports 304 and 305, and via 303 connects ports 306 and 307.

Figure 4:
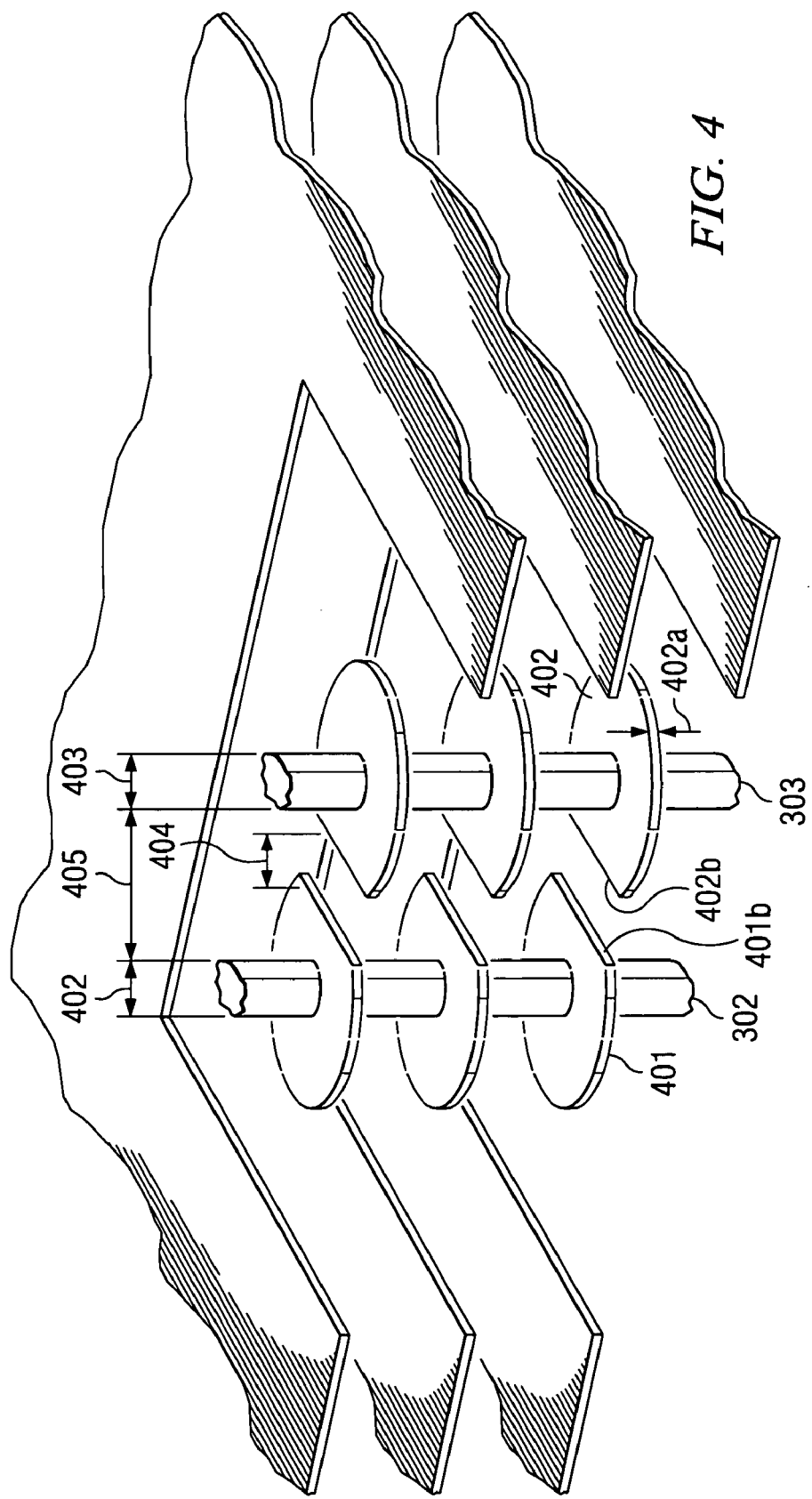
FIG. 4 is an enlarged detail of a portion of FIG. 3.

A small portion of the vias is magnified in the schematic perspective view of FIG. 4. As FIG. 4 shows, via 302 has a diameter 402, and via 303 has a diameter 403. Preferred values for via diameters are in the range from about 0.1 to 0.3 mm. These diameters may be identical to or different from each other. Further, vias 302 and 303 have a distance 405 from each other, which is at least as large as diameter 402 or 403.

As FIGS. 3 and 4 show, the metal of each via has sheet-like extensions in the planes of each metal layer. In the embodiment of FIG. 3, each via metal 302 and 303 has an extension in the plane of each metal layer 301*a*, 301*b*, etc. For instance, via metal 302 has extension 321*a* in metal layer 301*a*, extension 321*b* in metal layer 301*b*, etc.

FIG. 4 depicts these metal extensions in more detail. As examples of the plurality (shown in FIG. 3), extension 401 of the metal in via 302 and extension 402 of the metal in via 303 form a pair, because they have been created from the same metal layer in the stack of substrate metal layers. The overall shape of extensions 401 and 402 in FIG. 4 is indicated as approximately circular, but the extensions may be configured in any suitable shape. Since the extensions have been created from a metal layer of the stack in the substrate, they have the same thickness as the metal layer; an example is indicated by thickness 402*a*, which is preferably in the range from about 5 to 75 μm. The insulator (not shown in FIG. 4) between metal layers in the stack has preferably a thickness between about 25 and 800 μm.

In order to maximize the capacitance increase between metal-filled via 302 and 303, the extensions such as 401 and 402 are being brought together as close as practical. A preferred design feature to accomplish close proximity is to shape the extension portions 401*b* and 402*b* with linear or straight perimeter. The proximity 403 of these straight portions 401*b* and 402*b* is preferably 50% or more of the layer thickness 402*a*. For example, for an extension metal thickness of 10 μm, the proximity 403 of the straight extension portions is at least 5 μm.

When the plurality of capacitance increases between via 302 and 303 are added up for all extensions in FIG. 3, the impact on a possible reflection of a signal arriving at a via port (304 and 306, or 305 and 307) should be such that with the aid of the extensions only less than 10% of any arriving signal will be reflected. This design goal holds true for high frequency and low frequency signals.

Figure 5:
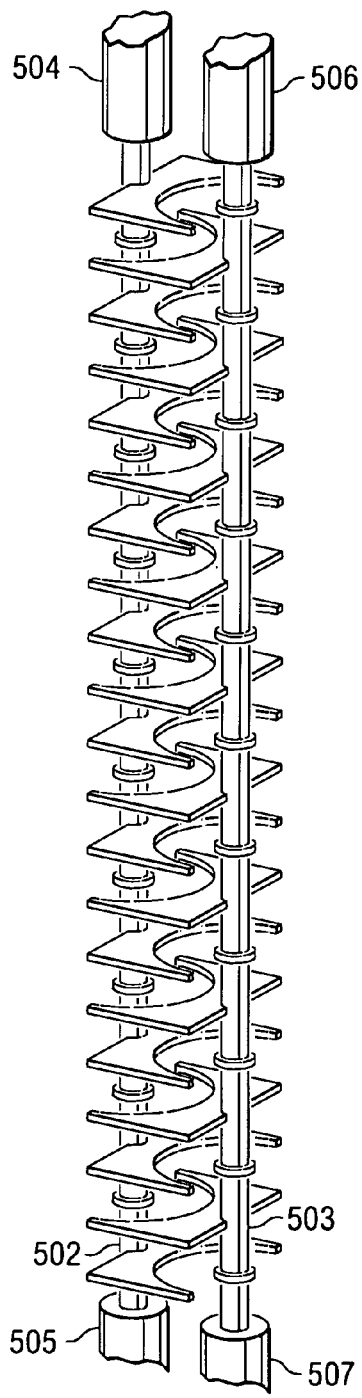
FIG. 5 illustrates a schematic perspective view of another embodiment of the invention comprising a pair of vias having metal extensions, traversing an insulating substrate.

Another embodiment of the invention to create lower impedance values by increasing the capacitance between vias is illustrated in FIG. 5. The embodiment uses again a planar insulating substrate with a plurality of parallel, planar metal layer embedded in the insulator. The embodiment, depicted in FIG. 5 in schematic perspective view, shows a pair of vias 502 and 503 traversing the planar substrate, which has the plurality of parallel, planar metal layers (not shown in FIG. 5), forming a stack of metal layers. Vias 502 and 503 are parallel to each other and filled with metal, preferably copper or copper alloy. The vias typically serve to connect metal ports on the substrate surfaces; for example, via 502 connects ports 504 and 505, and via 503 connects ports 506 and 507.

Figure 6:
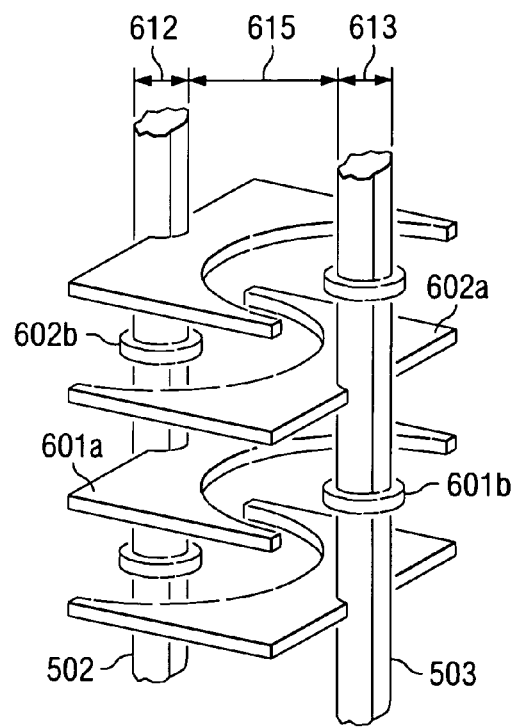
FIG. 6 is an enlarged detail of a portion of FIG. 5.

A small portion of the vias is magnified in the schematic perspective view of FIG. 6. As FIG. 6 shows, via 502 has a diameter 612, and via 503 has a diameter 613. Preferred values of via diameters are 0.1 to 0.3 mm. These diameters may be identical to or different from each other. Further, vias 502 and 503 have a distance 615 from each other, which is, for practical reasons, at least as large as diameter 612 or 613.

As FIGS. 5 and 6 show, the metal of each via has sheet-like extensions in the planes of selected metal layers. The metal extensions are shaped as flat forks arranged so that, in one plane of the stack of metal layers, the fork of the first via of the pair (for instance, fork 601 of via 502) is oriented towards, and partially surrounds, the second via of the pair (for instance, via 503 having left-over metal 601*b*), while in the next plane of the stack of metal layers, the fork of the second via (for instance, fork 602*a* of via 503) is oriented towards, and partially surrounds, the first via of the pair (for instance, via 502 having left-over metal 602*b*). The exact shape of the forks, the extent and configuration of how much they surround the adjacent via of the pair, and the amount of left-over metal on the first via of the pair, may be used as design variables for various embodiments of the invention; they depend partially on the electrical characteristics of the insulating substrate material and the number of metal layers in the substrate.

Other embodiments of the invention are high frequency semiconductor devices, which have substrates that take advantage of one or the other via metal extension features described above. An example of such embodiment is illustrated in the schematic perspective view and cross section of FIG. 7. The high frequency device generally designated 700 has a semiconductor chip 701 with at least one pair of bond pads 702a and 702b. A planar insulating substrate 703 has a plurality of parallel, planar metal layers 704a, 704b, . . . , and 704n embedded in the insulator (not shown in FIG. 7) and input/output ports 705a and 705b on the first substrate surface, and input/output ports 706a and 706b on the second substrate surface. Preferred insulating materials include ceramic and polymers, but may comprise any other insulating compound; the preferred thickness range of each layer is between 1000 and 2500 µm. Preferred metals for the conductive layers include copper, copper alloys, and nickel, but may comprise any other metallic or conductive material; the preferred thickness range of the layers is around 100 µm. The number of metal layers may vary from only few layers to more than 30. For high frequency devices in the 1 to 10 GHz regime, the preferred number of layers is between 15 and 25.

Substrate 703 has at least one pair of parallel, metal-filled vias 710 and 711 traversing the substrate. The vias have a diameter 720 and a distance 730 from each other of at least the diameter. Preferred via diameters range from 0.1 to 0.3 mm, and preferred distances for a via pair range from one to two diameter values. Via 710 connects the metal port 702a on the first surface with the port 706a on the second substrate surface, and via 711 connects port 702b and the first surface with port 706b on the second surface.

Figure 7:
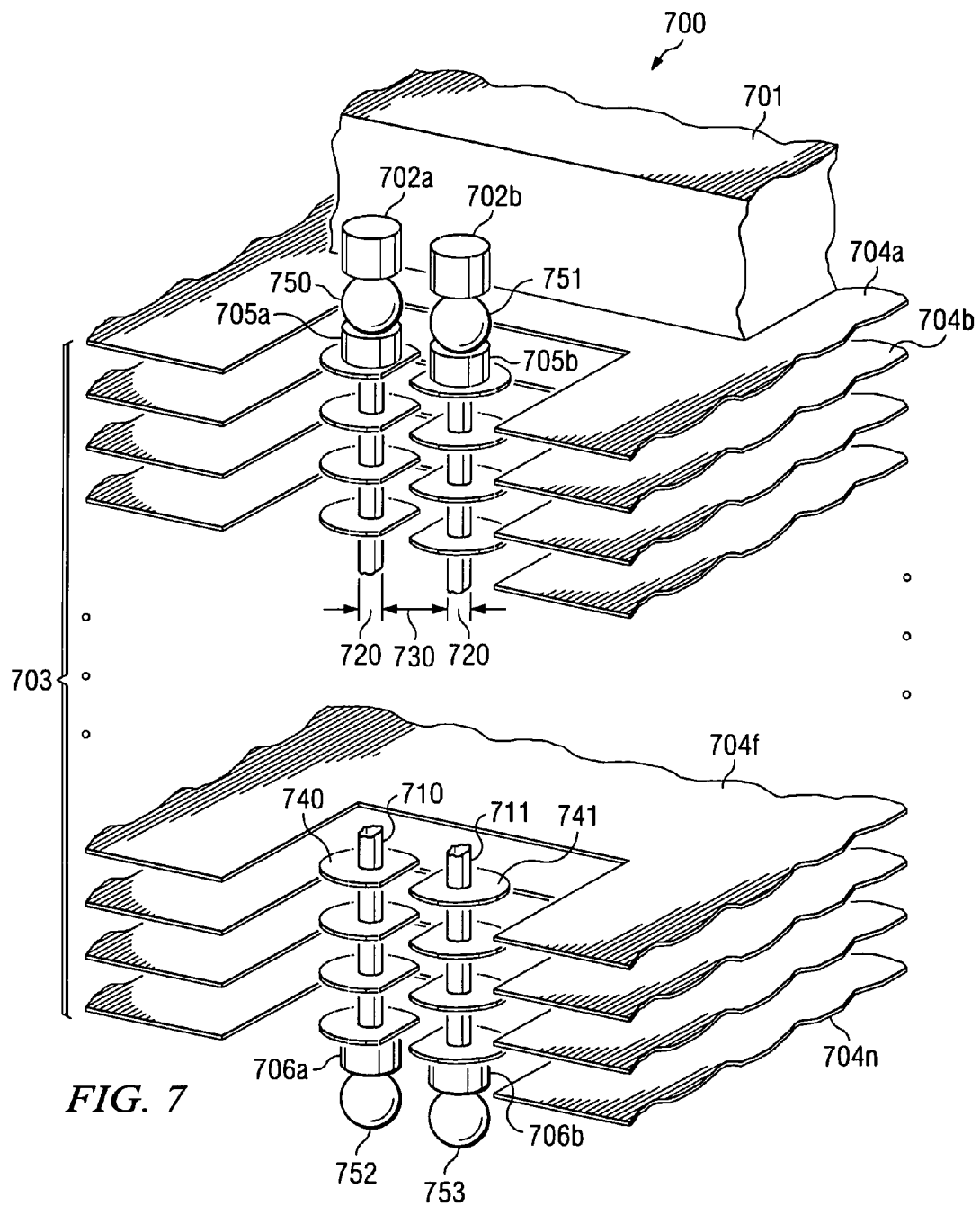
FIG. 7 illustrates a schematic perspective view of another embodiment of the invention comprising a semiconductor device having a flip-assembled chip on an insulating substrate with a plurality of parallel planar metal layers and a pair of vias with metal extensions.

The metals in each via have a sheet-like extension in each of selected planes of the metal layers. As an example, the metal of via 710 has extension 740 in the plane of metal layer 704f, and the metal of via 711 has extension 741 also in the plane of metal layer 704f. In the embodiment of FIG. 7, the metal extensions have the shape discussed in FIGS. 3 and 4. Other embodiments prefer extensions shaped as illustrated in FIGS. 5 and 6. It should be stressed, however, that numerous other geometrical configurations of the metal extensions serve the same via capacitance-enhancing purpose. As a result of the sheet-like extensions 740, 741, etc., the sum of the increased via capacitances reduces the reflection of a high frequency signal arriving at via ports 705a and 705b, or 706a and 706b respectively, to less than 10%.

Chip 701 is assembled on the first substrate surface so that each of the pair of chip bond pads is connected to one of the substrate ports on the first substrate surface. In the example of FIG. 7, bond pad 702a is connected to port 705a by metal bump 750, and bond pad 702b is connected to port 705b by metal bump 751. Preferably, metal bumps 750 and 751 are made of reflowable metal such as tin, tin alloys, or solder. Other bump materials have been employed, however, including conductive adhesives or z-axis conductors. It should be stressed that different interconnection means are also frequently employed, such as bonding wires; they may require a modified assembly scheme, as indicated in FIG. 2.

For the connection to external parts such as printed circuit boards or other devices, the second surface of substrate 703 has ports such as 706a and 706b. They may serve as pressure contacts to the external parts, or may have interconnection elements attached as shown in FIG. 7 by metal bumps 752 and 753. These metal bumps are preferably made of reflowable metal such as tin, tin alloys, or solder; however, other bump materials have been employed such as conductive adhesives.

Figure 8:
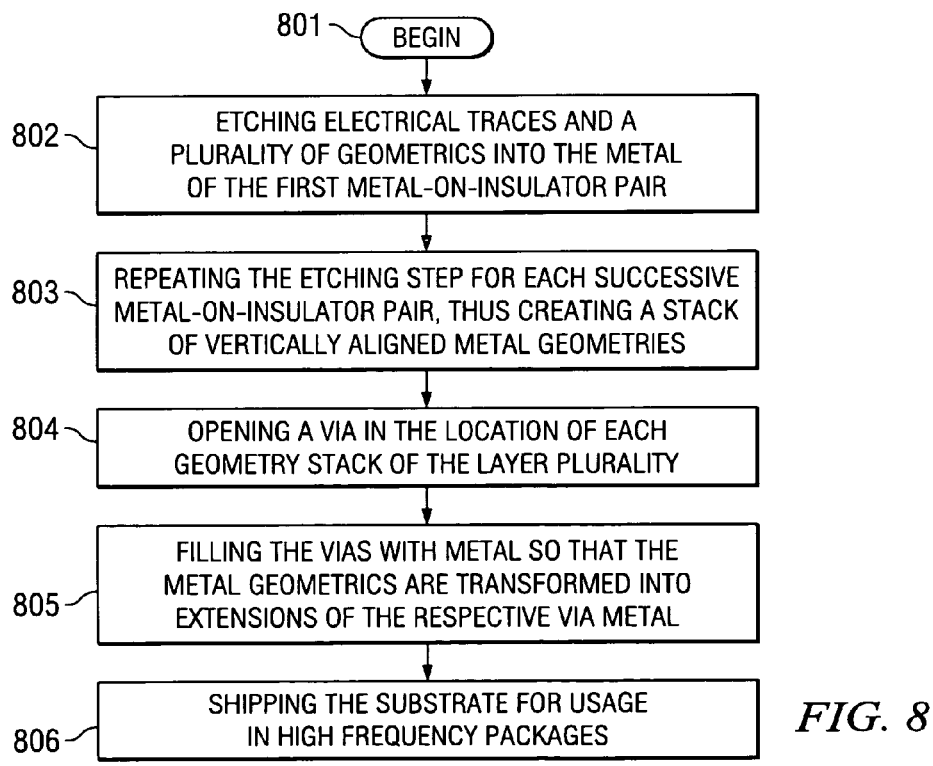
FIG. 8 shows a schematic block diagram of the process flow according to another embodiment of the invention for fabricating a substrate suitable for high frequency semiconductor packages.

Another embodiment of the invention is a method of fabricating a laminated substrate, which has a plurality of parallel, planar metal layers separated by insulating layers, wherein this substrate is specifically suitable for high frequency semiconductor packages. The method is summarized in the process flow diagram of FIG. 8, starts at the beginning step 801 and comprises the following steps:

Step 802: Etching electrical traces into the metal layer of the first metal-on-insulator pair, while concurrently etching a plurality of metal geometries separate from said traces.

The fact that this etching step creates simultaneously the electrical traces of the first metal layer, as well as, separate from these traces, the plurality of metal geometries integral to the invention, is the basis for the no-extra-cost nature of the fabrication method of the invention.

Step 803: Repeating the etching step of respective electrical traces and geometries for each successive metal-on-insulator pair, after each pair has been added in planar position onto the previous pair, thus creating step by step a stack of vertically aligned metal geometries.

Step 804: Opening a via in the location of each geometry stack of the layer plurality. The vias have a certain diameter, and the vias within a pair of vias have a distance from each other of at least this diameter.

Step 805: Filling the vias with metal so that electrical contact between the via metal and each respective metal geometry of each stack is established and the geometries are transformed into extensions of the respective via metal.

Step 806: Shipping the finished substrate for usage in high frequency semiconductor packages.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description.

As an example, the via distance of a via pair as well as the contours of the via metal extensions can be construed so that any via impedance can be achieved in order to avoid substantial signal reflection in high frequency devices. The impedance of 50 Ω described in the above embodiments is only one out of several examples.

Another example is an embodiment of the invention in substrates of high frequency devices, which have to be assembled with wire bonding rather than flip-chip technology.

It is therefore intended that the appended claims encompass any such modifications and embodiments.

I claim:

1. A substrate for a package of high frequency semiconductor devices, comprising:
   a planar insulating substrate having a plurality of parallel, planar metal layers embedded in said insulating substrate;
   at least one pair of parallel, metal-filled vias traversing said substrate, said vias having a diameter and a distance from each other of at least said diameter, said vias connecting metal ports on said substrate; and
   said metal in each via having a sheet-like extension in each of selected planes of said metal layers;
   said vias having a diameter of about 0.1 to 0.3 mm, and a distance from each other of about 0.1 to 0.3 mm.

2. The substrate according to claim 1 wherein said sheet-like metal extensions are configured so that each extension enhances the electrical via-to-via capacitance, and the sum of said increased capacitances reduces the reflection of a high-frequency signal arriving at said via ports to less than 10%.

3. The substrate according to claim 1, wherein said metal extensions are shaped approximately as rings, which surround each via in the plane of each metal layer, said extensions attached to the via metal.

4. The substrate according to claim 3 wherein said rings have straight perimeter portions where they are in close proximity to respective extensions attached to neighboring vias.

5. The substrate according to claim 4 wherein said proximity of said neighboring straight perimeter portions is at least 50% of the layer thickness of said metal extensions.

6. The substrate according to claim 1, wherein said metal extensions are shaped as flat forks arranged so that, in one plane of said metal layers, the fork of the first via of said pair is oriented towards, and partially surrounds, the second via of said pair, while in the next plane of said metal layers, the fork of said second via is oriented towards, and partially surrounds, said first via of said pair.

7. A substrate as in claim 1 wherein the insulating substrate between adjacent sheet-like extensions has a thickness of about 1000 to 2500 microns.

8. A high frequency semiconductor device comprising:
a semiconductor chip operable at frequencies of at least one gigahertz, said chip having at least one pair of bond pads;
a planar insulating substrate having a plurality of parallel, planar metal layers embedded in said insulating substrate and input/output ports on the first and second substrate surface;
said substrate having at least one pair of parallel, metal-filled vias traversing said substrate, said vias having a diameter and a distance from each other of at least said diameter, said vias connecting said metal ports on said first and second surface, said metal in each via having a sheet-like extension in each of selected planes of said metal layers;
said chip assembled on said first substrate surface so that said at least one pair of chip bond pads is connected to one pair of said substrate ports on said first substrate surface, respectively; and
interconnection elements attached to said ports on said second substrate surface for connection to external parts;
said sheet-like extensions configured so that each extension enhances the electrical via-to-via capacitance, and the sum of said increased capacitances reduces the reflection of a high-frequency signal arriving at said via ports on said first or second substrate surface to less than 10%.

9. The device according to claim 8 wherein said connections between said pair of chip bond pads and said substrate ports on said first substrate surface are metal bumps.

10. The device according to claim 8 wherein said connections between said pair of chip bond pads and said substrate ports on said first substrate surface are bonding wires.

11. The device according to claim 8 wherein said interconnection elements are metal reflow bumps.

12. A substrate as in claim 8 wherein the insulating substrate between adjacent sheet-like extensions has a thickness of about 1000 to 2500 microns.

13. A substrate for minimizing the differences between the impedance of a package via structure and the impedance of high frequency signal transmission lines in a semiconductor device, comprising:
a planar insulating substrate having a plurality of parallel, planar metal layers embedded in said insulating substrate;
at least one pair of parallel, metal-filled vias traversing said substrate, said vias having a diameter and a distance from each other of at least said diameter, said vias connecting metal ports on said substrate;
said metal in each via having a sheet-like extension in each of selected planes of said metal layers; and
said vias having a diameter no greater than about 0.3 mm, and a distance from each other no greater than about 0.3 mm.

14. A substrate as in claim 13 wherein the insulating substrate between adjacent sheet-like metal extensions has a thickness of about 1000 to 2500 microns.

* * * * *